(12) United States Patent
Rosales

(10) Patent No.: US 12,289,859 B2
(45) Date of Patent: Apr. 29, 2025

(54) PORTABLE AIR COOLER

(71) Applicant: Steven R Rosales, Gilbert, AZ (US)

(72) Inventor: Steven R Rosales, Gilbert, AZ (US)

( * ) Notice: Subject to any disclaimer, the term of this patent is extended or adjusted under 35 U.S.C. 154(b) by 121 days.

(21) Appl. No.: 18/344,699

(22) Filed: Jun. 29, 2023

(65) Prior Publication Data

US 2023/0389222 A1 Nov. 30, 2023

Related U.S. Application Data

(63) Continuation-in-part of application No. 17/225,995, filed on Apr. 8, 2021, now Pat. No. 11,713,907.

(60) Provisional application No. 63/013,446, filed on Apr. 21, 2020.

(51) Int. Cl.
*H05K 7/20* (2006.01)
*F24F 5/00* (2006.01)
*F25D 3/08* (2006.01)

(52) U.S. Cl.
CPC ........ *H05K 7/20145* (2013.01); *F24F 5/0017* (2013.01); *F25D 3/08* (2013.01); *F25D 2317/063* (2013.01)

(58) Field of Classification Search
CPC ..... F25D 3/02; F25D 3/04; F25D 3/06; F25D 3/08; F25D 3/125; F25D 23/026; F25D 2317/068; F25D 2317/0681; F25D 2317/0682; F25D 2323/0028; F25D 2323/00281; F24F 5/0017; F24F 1/02; F24F 1/028; F24F 1/0287; F24F 1/029; F24F 2221/36
See application file for complete search history.

(56) References Cited

U.S. PATENT DOCUMENTS

| | | | | |
|---|---|---|---|---|
| 6,571,568 B1 * | 6/2003 | Link | ................ | B60H 1/00264 62/421 |
| 10,667,636 B1 * | 6/2020 | Byrd | ................ | A47G 19/2288 |
| 2005/0016199 A1 * | 1/2005 | Blackstone | ........... | F24F 5/0017 62/421 |
| 2008/0022712 A1 * | 1/2008 | Carr | ...................... | F24F 5/0017 62/425 |
| 2008/0184725 A1 * | 8/2008 | Leitner | ................ | B60H 1/3235 62/337 |
| 2019/0093909 A1 * | 3/2019 | Floyd | ..................... | A45C 11/20 |
| 2021/0070346 A1 * | 3/2021 | Roberts | ..................... | F24F 11/30 |

* cited by examiner

*Primary Examiner* — Joseph F Trpisovsky

(57) ABSTRACT

A portable air cooler is fashioned as a storage chest for ice cubes, dry ice, or other pre-chilled articles such as reusable freezable blocks. Sidewalls of the chest include air intakes, and a baffle forces intake air to pass by or through the chilled articles to that the air is cooled by heat exchange. Fans in the chest lid exhaust the cooled air, which may be used to cool waste heat from a heat-producing device lain atop the chest. The lid also includes stand-offs to allow airflow under the device being cooled, and guardrails help maintain the device in position over the fans providing cooling air and prevent the device from being casually knocked off the top of the lid of the chest.

17 Claims, 6 Drawing Sheets

PORTABLE AIR COOLER

CROSS REFERENCE TO RELATED APPLICATION

This non-provisional utility patent application is a continuation-in-part application proceeding from U.S. non-provisional utility patent application Ser. No. 17/225,995 "Portable Air Cooler," filed 8 Apr. 2021. The U.S. non-provisional utility patent application Ser. No. 17/225,995 "Portable Air Cooler," filed 8 Apr. 2021 claims the benefit of and priority to U.S. provisional application Ser. No. 63/013,446 "Portable Air Cooler," filed 21 Apr. 2020. The entire contents of U.S. non-provisional utility patent application Ser. No. 17/225,995 "Portable Air Cooler," filed 8 Apr. 2021 and U.S. provisional patent application Ser. No. 63/013,446 "Portable Air Cooler," filed 21 Apr. 2020 are incorporated into this document by reference.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The invention relates to a portable cooler for electronic equipment which emit waste heat.

BACKGROUND

Some portable electronic equipment generates substantial amounts of heat which must be exhausted or rejected to atmosphere. Ambient temperatures in deserts and tropical or equatorial climes may be too high to absorb waste heat from audio, gaming, and computing systems used outside in these environments, causing precautionary shut downs or heat related damage or reduced service life.

Unfortunately, many electronic products were designed to operate in air not much exceeding 90° F. It would be desirable to provide a device for supplying cooler-than-ambient air to heat emitting equipment when these are used in higher temperature environments.

BRIEF DESCRIPTION

A primary objective of the invention is to provide cooled air to a heat-emitting electronic device operating in ambient air which is too hot to cool the unit effectively when drawn through the housing of the device.

Another objective of the invention is to take in air and cool it before exhausting cooled air for intake by the device to be cooled.

Phase changes of materials such as melting of ice, evaporation of water, or sublimation of dry ice (solid carbon dioxide) may be used effectively to cool air to temperatures substantially below ambient temperature. It is another objective of the invention to provide a convenient and portable container or chamber for containing materials undergoing phase changes as they lower the temperature and enthalpy of air being conditioned for entry into electronic devices to be cooled. A corollary objective of the invention is to provide ducting structures which prevent intake air from proceeding directly to an exhaust port of the container without first passing through cool materials prepared for heat exchange with the air passing by.

In the case of melting ice into water in the presence of air to be cooled, another objective of the invention is to separate outgoing cooled air from the cooling container from unwanted water so that the air entering the device to be cooled does not entrain water droplets or other foreign matter which may damage the equipment being cooled.

BRIEF DESCRIPTION OF THE DRAWINGS

A further understanding of the nature and advantages of particular embodiments may be realized by reference to the remaining portions of the specification and the drawings, in which like reference numerals are used to refer to similar components. When reference is made to a reference numeral without specification to an existing sub-label, it is intended to refer to all such multiple similar components.

FIG. 8b shows an exploded view of components of the alternative embodiment of the portable air cooler of FIG. 8a.

DETAILED DESCRIPTION of CERTAIN EMBODIMENTS

Figure 1:
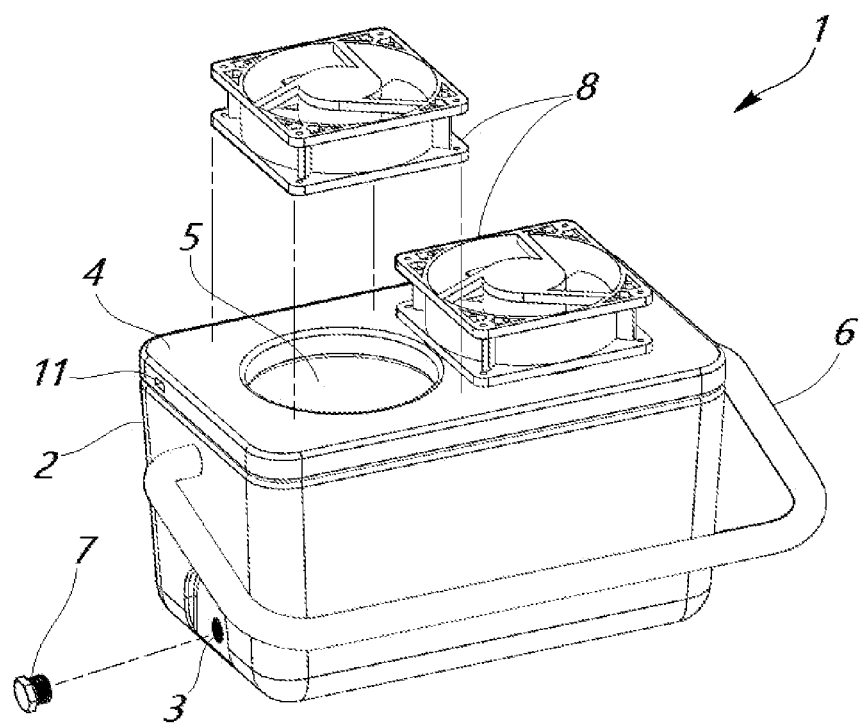
FIG. 1 shows an oblique view of a first embodiment of a portable air cooler in accordance with the invention.

While various aspects and features of certain embodiments have been summarized above, the following detailed description illustrates a few exemplary embodiments in further detail to enable one skilled in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art, however, that other embodiments of the present invention may be practiced without some of these specific details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

In this application the use of the singular includes the plural unless specifically stated otherwise, and use of the terms "and" and "or" is equivalent to "and/or," also referred to as "non-exclusive or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise. Also in this specification, the term "means for . . . " as used herein including the claims, is to be interpreted according to 35 USC 112 paragraph 6.

The invention is a portable air cooler fashioned as a storage chest for ice cubes, dry ice, or other pre-chilled articles such as reusable freezable blocks. Sidewalls of the chest may include air intake vents and a baffle which forces intake air to pass by or through the chilled articles so that the air is cooled by heat exchange. When the lid is closed, fans in the chest lid exhaust the cooled air, which may be used to cool waste heat from a heat-producing device lain atop the chest. The lid also includes a plurality of struts arising from its external surface that allow airflow under the device being cooled, and may include guardrails to help keep the device residing over the fans providing cooling air, and prevent the device from being casually knocked off the top of the lid of the chest.

The device to be cooled may commonly be a laptop computer or music mixer board, or may be a gaming console, or a radio transmitter. These electronic or electrical devices generate waste heat from components such as semiconductors, power supplies, lamps, and vacuum tubes in some cases. Most such electrical products are designed to be used at ambient conditions where the temperature difference between the air around them and their heat-generating components allows sufficient rejection of waste heat to limit steady state device temperatures. However, when these devices are used in hotter ambient air conditions, they may run hotter and either incur damage or shut down if they have thermal protection devices which trip once a temperature maximum is exceeded. Also, device life may be extended by protecting them from extreme heat, because in addition to thermal aging of semiconductors and tube components, also solder joints, insulation on wiring, and plastic components such as board spacers, elastomeric seals, vibration absorbers, and wire grommets may age prematurely and degrade when exposed to prolonged heat.

The invention allows devices designed for use in more modest climates to be used in extreme temperature conditions such as keeping entertainment electronics cooled while in use in desert heat, but may also be used to keep electronics running in other hot climates when air conditioning or utility power has failed, such as keeping an amateur radio running for emergency communications in the aftermath of a weather-induced power blackout, or for cooling military electronics in a remote region lacking conventional, climate-controlled buildings.

Additionally, although the invention is primarily directed to allow devices to function on locally and immediately cooled air in high-temperature conditions, it is also possible to use the device in extremely frigid conditions where the contents of the chest are hot articles and the heated exhaust air is used to protect or prevent a device susceptible to extreme cold from shutting down prematurely.

Referring now to the figures, FIG. 1 shows an oblique view of a first embodiment of a portable air cooler [1] in accordance with the invention. The cooler is has a thermally insulated compartment which in this embodiment is a box [2] with a floor and sidewalls and a thermally insulated lid [4.] The lid is pierced by at least one aperture [5] defining an air passageway. Each aperture in the lid has a fan [8] aligned with the air passageway defined by the aperture. The fans are electrically connected to a power receptacle [11] affixed to or embedded into the lid. Depending on the size of the power receptacle, an extension cord, or a cable, or discrete wires may be used to connect the fan power receptacle to a power source such as a utility power socket, jumper cables, or alligator clips attached to a battery. Optionally but preferably the invention may include a carrying handle [6] or a carrying strap or sling, and these may be permanently attached or they may be detachable. In a preferred embodiment the compartment may be pierced by a drain aperture [3] communicating outside the compartment and the drain may be fitted with a stopper or a threaded plug [7.]

In this specification a "power receptacle" may mean any from among a number of affordances including but not limited to terminal strips, binding terminals, banana jacks or circular connectors, a DIN power connector or a connector of the pin and socket type, which is often called a "Molex connector." Named after a prominent connector company still in operation, "Molex connector" is now used as a vernacular term for a two-piece pin and socket interconnection typically used for wire harness connections from computer power supplies to motherboards and computer peripherals such as storage disc drives and media drives such as CD-ROM and DVD-ROM drives. A DVI connector may also be used as a power receptacle, however, preferred power receptacles conform to industry standards which are smaller than these and include USB ports, micro USB ports, HDMI, Mini-HDMI, and Micro HDMI ports, DisplayPorts and Mini DisplayPorts, Thunderbolt ports, VGA and Mini-VGA ports, and Mini-DVI, and Micro-DVI ports.

Figure 2:
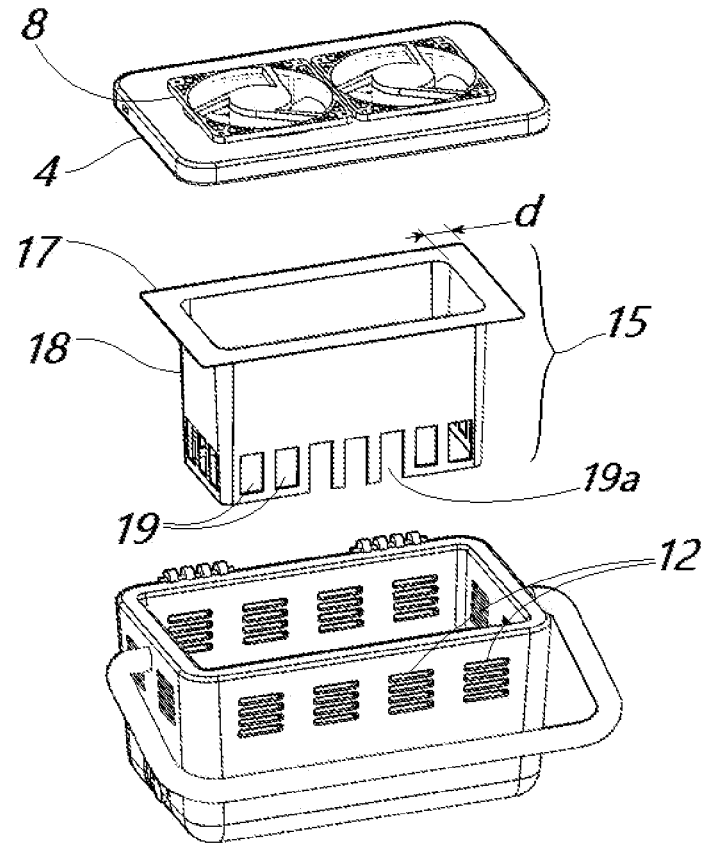
FIG. 2 shows an oblique, exploded view of an alternative embodiment of a portable air cooler in accordance with the invention.

FIG. 2 shows an oblique, exploded view of an alternative embodiment of a portable air cooler in accordance with the invention. In this embodiment the lid [4] has fans [8] embedded within the lid rather than being secured to the top as was seen in FIG. 1. In this embodiment the fans are located in the middle of the air passageway defined by the apertures which pierce the lid, which is hingeably attached to the chest or box portion of the cooler.

The box portion of the cooler has sidewalls and a floor which define a compartment having interior surfaces and an interior rim of the compartment. At least one such sidewall is pierced by at least one intake vent [12] and preferably more than one or all sidewalls include arrays of vents which may preferably be numerous and narrow as shown, or may have larger openings which are covered by louvered plates or screens to exclude undesirable indrawn foreign matter or insects.

A baffle component fits [15] inside the chest. It has a membrane surface having a contour or perimeter complementary to the interior rim of the compartment of the chest. The planar surface is a flange [17] extending from the upper end of a duct [18] which pierces the membrane, and the duct has a perimeter wall or contour offset from at least one of the interior surfaces of the compartment. In this view the duct is offset from all four interior sidewalls of the chest by an offset dimension "d."

According to one subset of embodiments within the scope of the invention, the flange of the duct may include a compressible material such as an elastomer so that the flange may rest atop the rim of the chest and be sandwiched into place when the lid of the chest is shut. According to another subset of embodiments within the scope of the invention, the perimeter of the flange is complementary to the interior walls of the compartment at a plane beneath the rim of the chest, such as for an embodiment having sidewalls with inward draft angles, where a baffle flange perimeter is smaller than the perimeter of the rim of the compartment but will seat down partway inside the chest.

According to some embodiments the duct portion of the baffle further comprises at least one cutout in its walls such as a cutout which is an aperture [19.] Alternatively, cutouts may also extend to the bottom rim of the duct such that they act as crenels [19a] between merlons of material which extend downward and suspend the baffle up from the floor of the compartment.

Figure 3:
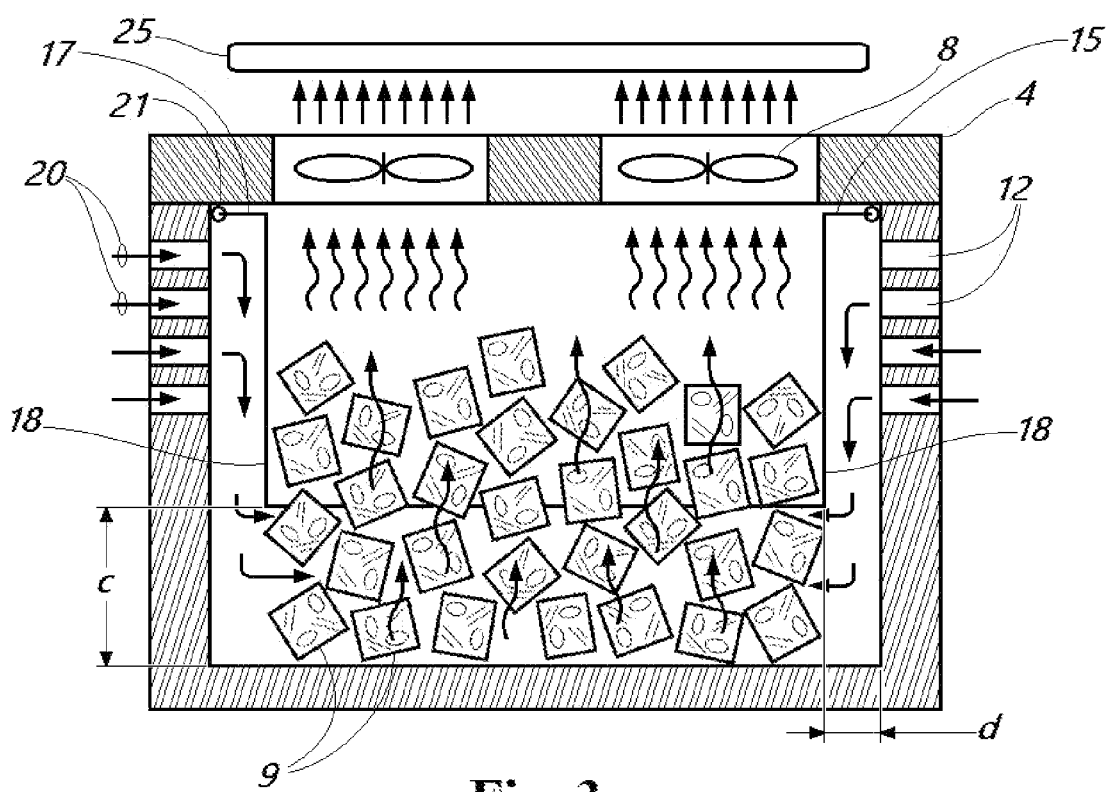
FIG. 3 shows a stylized view of components of yet another embodiment of a portable air cooler in accordance with the invention, in operation.

FIG. 3 shows a stylized view of components of yet another embodiment of a portable air cooler in accordance with the invention, in operation. The device [25] to be cooled is suspended above the lid of the cooler lid [4.] Fans [8] attached to or embedded within the lid draw cooled air from the compartment and direct it to the underside of the device to be cooled. Advantageously, if this device has its own fans and underside inlets, the cooled air supplied by the cooler may then be drawn into the device so that its waste heat may be removed more efficiently than if it were to draw on ambient air.

The compartment contains the baffle [15] and the duct [18] of the baffle extends downward within the volume of the compartment, which is filled with ice [9] cubes or previously chilled articles such as chilled blocks of ice or of other materials having a high specific heat. Commercial products such as reusable or refreezable refrigerant blocks may also be deposited within the duct volume.

Although the baffle in the embodiments explained in the previous figure rests on the floor of the compartment and either has aperture which admits air into its central volume or has spaced-apart standoffs which prop the baffle duct up off the floor of the compartment, in this embodiment shown, at least a portion of the perimeter of the flange [17] of the baffle further comprises a compressible member such as a perimeter seal [21] which retains the baffle snugly in place by contact with any one of the sidewalls of the compartment, to maintain a gap "c" between the bottom rim of the baffle duct and the compartment floor.

Airflow throughout the system is illustrated by numerous arrows [20] in this figure. As cooled air is removed from the compartment by the fans, it is replaced by air drawn through the vents [12.] With the perimeter walls of the duct being offset from the interior sidewalls of the compartment by a spacing dimension "d," the indrawn air proceeds downward along the exterior of the duct until it reaches apertures or cutouts in the duct or passes beneath the bottom end of the duct, where it may then enter into the interior volume of the duct. Along this path and leading up to the exhaust fans the air passes by the ice or other chilled articles and is cooled by heat exchange with them. The cooled air is then exhausted by the fans and directed at the device to be cooled.

Figure 4:
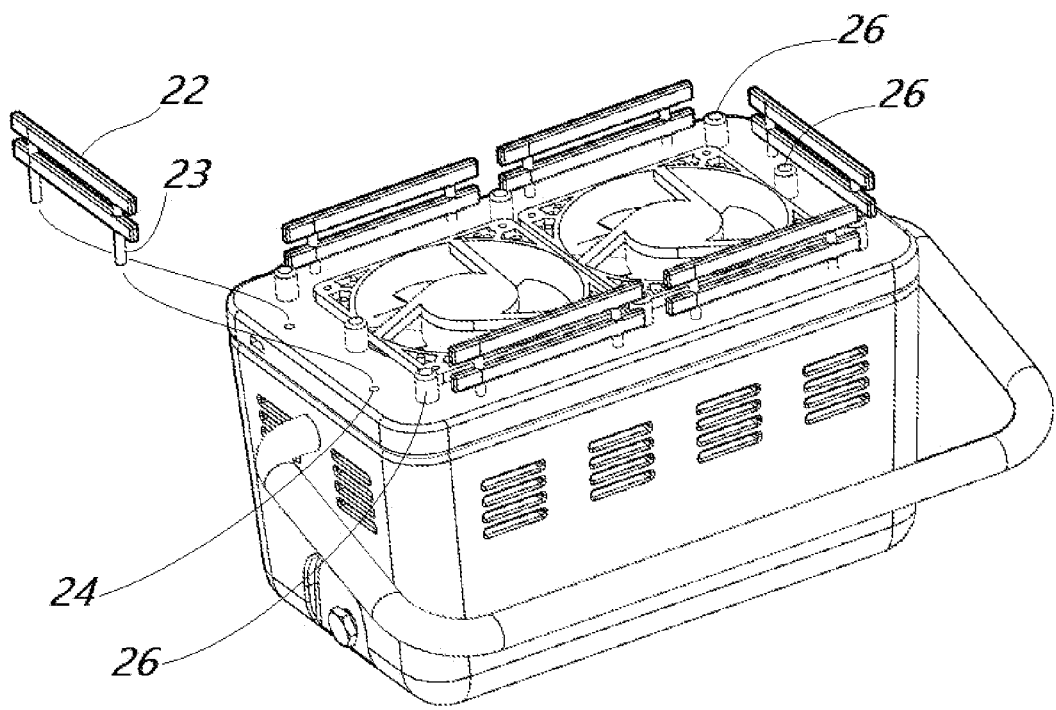
FIG. 4. shows an oblique view of another alternative embodiment of a portable air cooler in accordance with the invention, having removable sections of fence for locating a device to be cooled so that it resides directly above fans providing cooled air.

FIG. 4 shows an oblique view of another alternative embodiment of a portable air cooler in accordance with the invention, having removable sections of fence [22] for locating a device to be cooled so that it resides directly above fans providing cooled air. Each of one or more fence section components includes one or more posts [23] which insert into complementary patterns of post-receiving apertures [24] located preferably near or along the periphery of the cooler lid. Fence section components may include sets of slats or they may present solid guardrails which surround and halt the device being cooled should some other sliding force arise to pull the device to fall from the cooler lid. Preferable embodiments of fence section components include more than one post, and complementary patterns of post-receiving apertures formed in the lid. The posts are preferably retained in their apertures by friction fit.

An additional feature of the invention is the incorporation into the lid of moveable struts [26,] which may be moved into retracted and extended positions. The retracted position is preferably flush with the cooler lid, and in the extended position a plurality of these standoffs prop up the device being cooled to allow cooled air delivered from below to circulate freely. In simpler embodiments, the standoffs hold their positions by friction fit which may include tactile detents by which a user feels a "click-in" or "click-out" when the standoffs arrive at their retracted or extended position.

However, other preferable embodiments include mechanical assistance between retracted and extended positions such as latch and release with a click mechanism. General descriptions include spring loaded push down and turn mechanisms and push button latch and release devices. More specifically the click mechanism is engaged when a standoff is depressed into or below its retracted position, and when the standoff is pushed again the click mechanism is disengaged and the standoff ascends to its extended position. Preferred mechanisms include sensible tactile detents and audible clicks.

Figure 5:
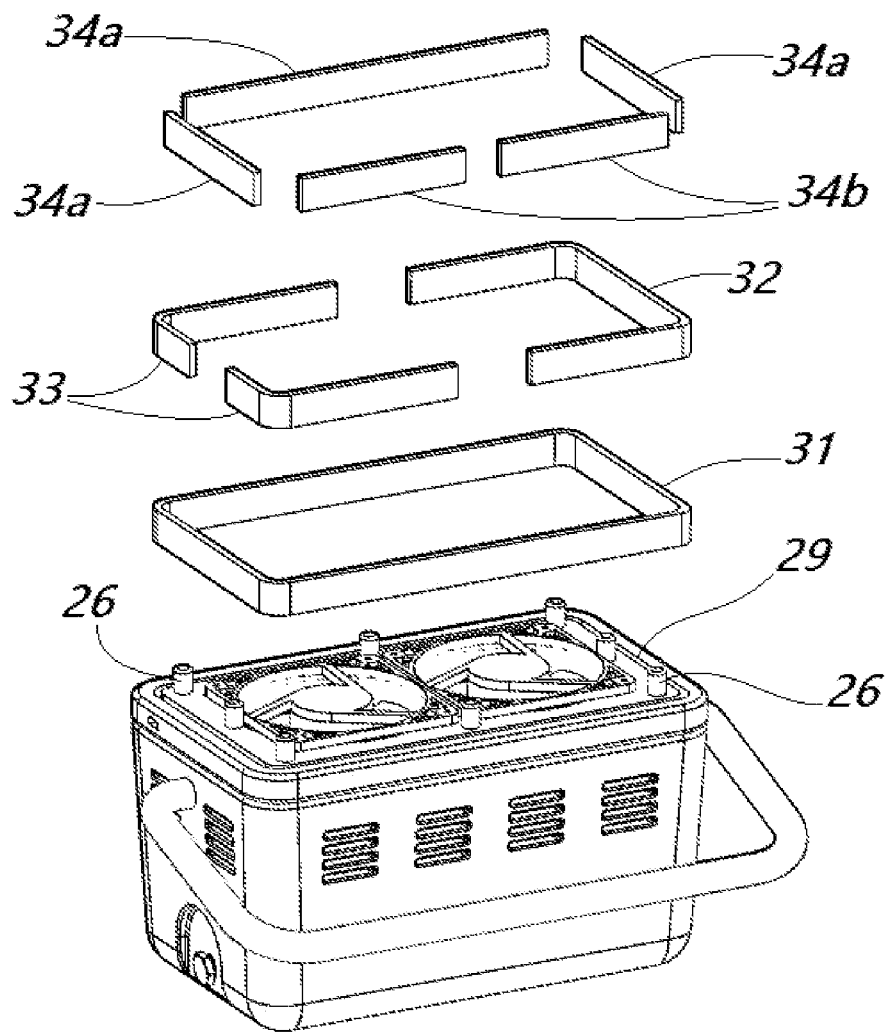
FIG. 5 shows an oblique view of an alternative embodiment of a portable air cooler in accordance with the invention and several alternatives of pop-up or removable fence components.

FIG. 5 shows an oblique view of an alternative embodiment of a portable air cooler in accordance with the invention and several alternatives of pop-up or removable fence components. Retractable struts [26] are incorporated into the lid as explained above, for supporting the device to be cooled so that cooled air from the cooler compartment may be directed to the device from beneath. Although the struts may be rigid stand-offs, in preferred embodiments they operate like extendable and retractable push buttons as explained above.

The lid of this particular set of embodiments may further comprise a groove [29] sized to define a perimeter within which the device to be cooled resides. Fence section components [34a,] which may be ornate or as simple as insertable tabs or slats, are received within the groove at various locations around the lid to surround and halt the device being cooled should some other sliding force arise to pull the device to fall from the cooler lid. For a groove having a long, straight portion along its length, more than one fence section component [34b] may be inserted so that a gap between them allows for cables or wiring to be connected to the device being cooled.

For a lid having a continuous groove with a closed contour, a guard component [31] moveable between an extended position and a retracted position may be fashioned complementary to the groove. The guard may be raised and lowered and may hold its position by friction fit or it may further incorporate click down and click release mechanisms. The guard may be of a continuous closed contour to match the groove, or the groove may receive a plurality of sectional guard components, such as half-section guards

[32] or quarter-section guards [33.] For half- and quarter-section guards, these components may comprise at least a first straight section and second straight section, and an arcuate section residing between the first and second straight section.

Alternatively, the lid may comprise several grooves defining a sufficient portion of a theoretical closed contour such that guard components inserted into the groove or operating as click-up portions of a sectional wall act in concert to contain the device being cooled within the theoretical closed contour. Additionally, a plurality of pop-up studs which rise higher than the standoffs may act in concert as bollards or bumpers defining a perimeter or a partially closed or a closed contour.

Figure 6:
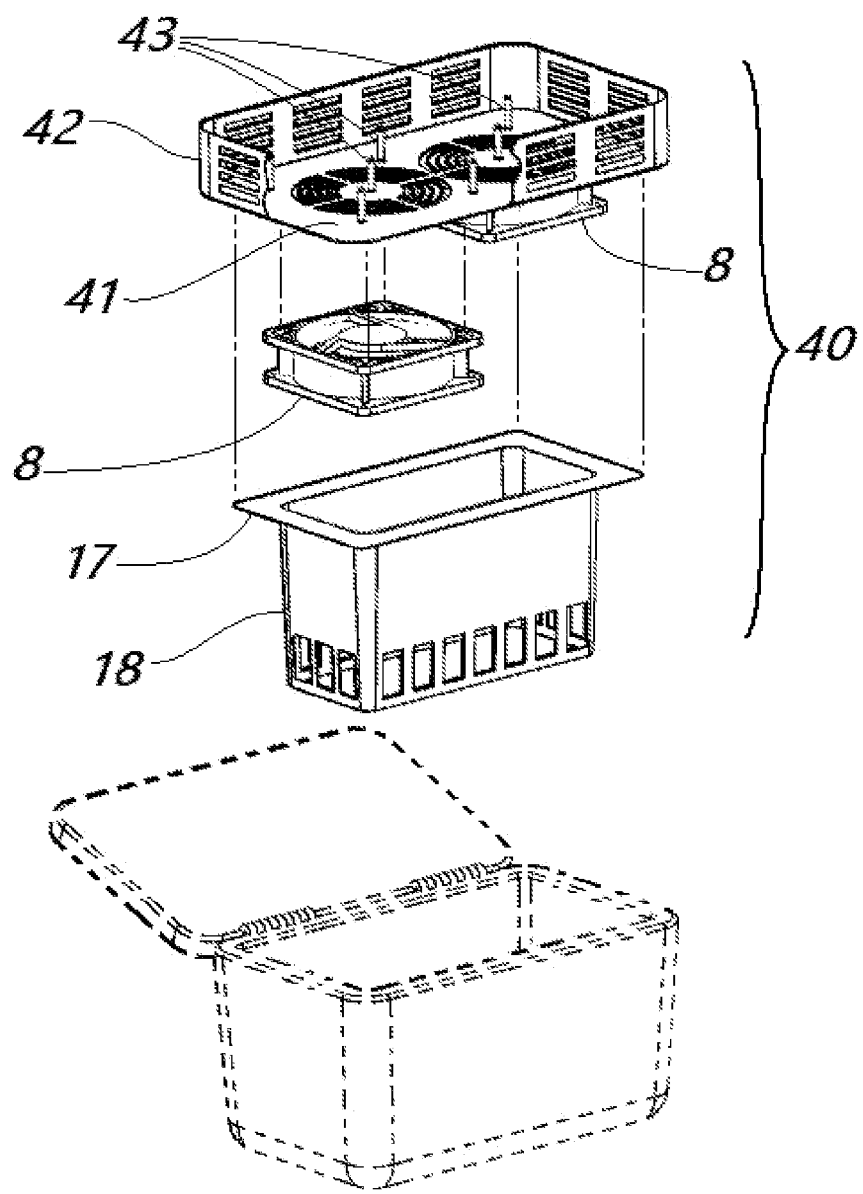
FIG. 6 shows an exploded view of an alternative embodiment of a portable air cooler in accordance with the invention which is designed to operate with an off-the-shelf cooler or ice chest.

FIG. 6 shows an exploded view of an alternative embodiment of a portable air cooler [40] in accordance with the invention, which is designed to operate with an off-the-shelf cooler or ice chest, also called a cooler chest. The portable cooling system includes a plate dimensioned or sized to occlude a cross section of a cooler chest so that it either drops partway into the chest so that the perimeter of the plate becomes lodged within the interior walls of the cooler chest as was seen in FIG. 3, or so that the bottom of the duct may rest on the floor of the cooler chest. Alternatively, the plate may be sized to rest atop the rim of the chest and sized so that the perimeter of the plate covers most or preferably all of the volume of the chest.

The plate [41] has a first side or underside surface, and a second side or top surface opposite the first side. The cooler chest has at least one interior surface, and typically four interior walls and a floor. However this device may also work favorably with a cooler chest having more unusual shapes such as a hollow hemi-sphere or a hollow half-watermelon shape, where the interior would have only one surface. The plate would have a shape complementary to the rim of the chest or a cross section partway down inside the chest so that it would drop in and occlude a cross section near the top of the chest and define a cooling volume there below.

A duct [18] is attached to the first side or underside of the plate, defining an interior volume. The duct has perimeter wall offset from at least one interior surface of cooler chest. For a rectangular chest, the duct is preferably offset from all four interior walls of the chest. The top side of the plate further includes a perimeter fence [42] and the plate is also pierced by at least one fan vent communicating with the interior volume of the duct. One or more fans [8] are attached to the plate and aligned with the fan vents. Chilled objects are then deposited in the cooling volume within the duct.

The second side or top side of the plate has a set of stand-offs [43] which rise above the fans and the fan vents. Although the fans are shown mounted beneath the plate, they may be mounted on top of the plate and over the fan vents, with the stand offs rising even higher than the tops of the fans. A device to be cooled may then be placed atop the set of stand-offs, and the clearance between the underside of the device and the fans provides an air gap for air to escape after carrying off heat from the device. The perimeter fence is preferably ventilated to also allow egress for the used air. The perimeter fence preferably rises higher from the top of the plate than the stand-offs so that it may better retain the device being cooled.

Embodiments of the invention may be manufactured with the plate being injection molded and with the stand-offs and the duct being integral to the plate, and the perimeter fence around the plate also being integral to the plate, or these components may be made separately and assembled. Alternatively, embodiments of the invention may be manufactured with the plate, fence, and duct being made from sheet metal, with the duct being a deep-drawn component with a flange [18] for attachment to the underside of the plate. The attachment means may include adhesives, welding, spot-welds, or mechanical interlocking means such as slots and tabs, or interference fits.

The duct may include one or more cutouts, apertures, or crenellations, or the embodiment may be designed so that the bottom of the duct rests above the floor of the cooler chest.

Figure 7:
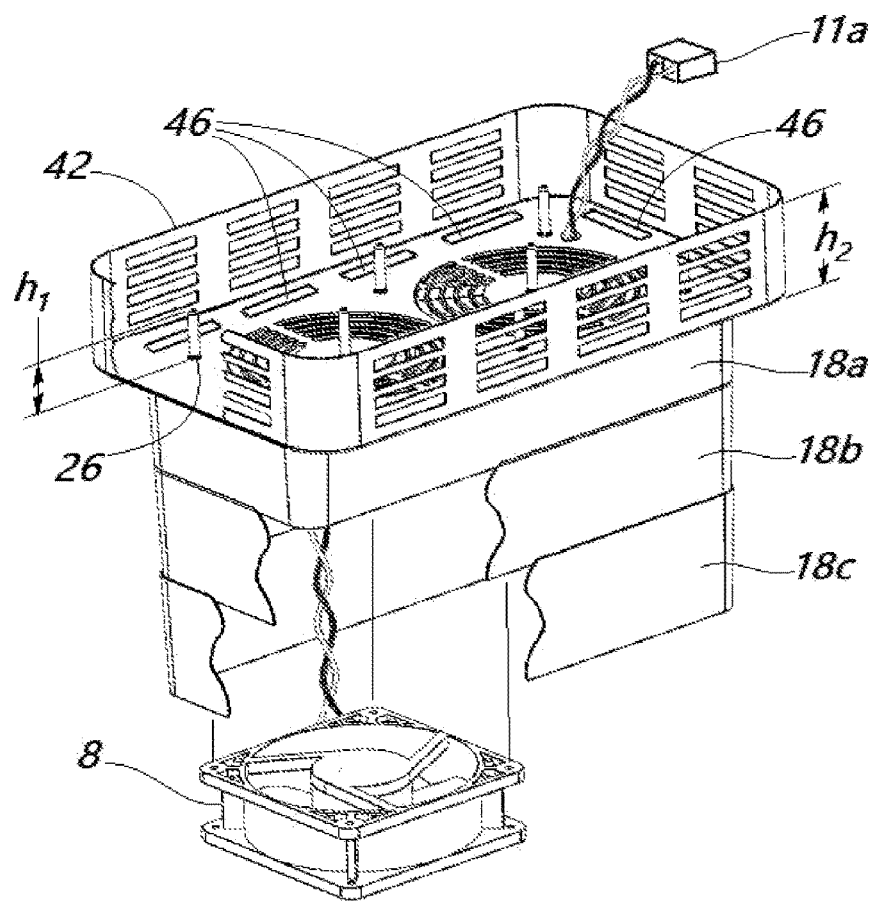
FIG. 7 shows yet another alternative embodiment of a portable air cooler in accordance with the invention, as designed to operate with an off-the-shelf cooler or ice chest, with the version shown including a telescoping duct.

FIG. 7 shows yet another alternative embodiment of a portable air cooler in accordance with the invention, as designed to operate with an off-the-shelf cooler or ice chest, with this style including a telescoping duct having a plurality of concentric segments [18a,] [18b,] and [18c.] The telescoping duct may be adjusted to create a desired gap between the floor of the cooler chest and the lowest portion of the duct. A telescoping duct may also be convenient for reducing the storage volume of the invention when not in use. The plate is also pierced by at one or more apertures [46] which do not communicate with the interior volume of the duct. These apertures allow ingress air down into the cooler chest along the outside of the duct, which is then drawn into the interior volume of the duct from beneath its bottom extent. The in-drawn air then exchanges heat with chilled articles and is drawn through the fans as cooled air which is directed at the device to be cooled.

A portion of the perimeter fence [42] is shown cut away to examine the support pins which prop the device to be cooled above the fans so they may supply cooled air to the underside of the device. The pins have a first height $[h_1]$ above the plate and the perimeter fence is of a second height $[h_2]$ greater than the pin heights so that even while resting on the plurality of pins the device is corralled by the perimeter fence so as to be less likely to slip off and fall in the event that the cooling apparatus is jostled or not completely level. Vibration from the fans may also cause the device to float around on its pins, and the perimeter fence in preferred embodiments is made taller than the pins.

Additionally, the portable cooling system includes means for providing electrical power to the fans [8.] These means may include braided wire as illustrated, or coaxial cable, or flexible PC strips (FPCs) or the plate may include printed circuit vias which electrically connect to the fans as these are mechanically mounted to the plate. The plate may also include selectively plated over-molded plastics to create conductive paths for delivering power to the fans. The means for providing electrical power to the fans preferably includes a plug [11a] which may be connected to utility power, or may be a USB connector or a connector mateable with a micro USB port, HDMI, Mini-HDMI, or a Micro HDMI port, DisplayPort, Mini DisplayPort, or Thunderbolt port, or the like, so that the fans may draw power when connected to the device being cooled. Without such a plug, the fans may be powered by wire ends being attached to terminal strips.

Figure 8A:
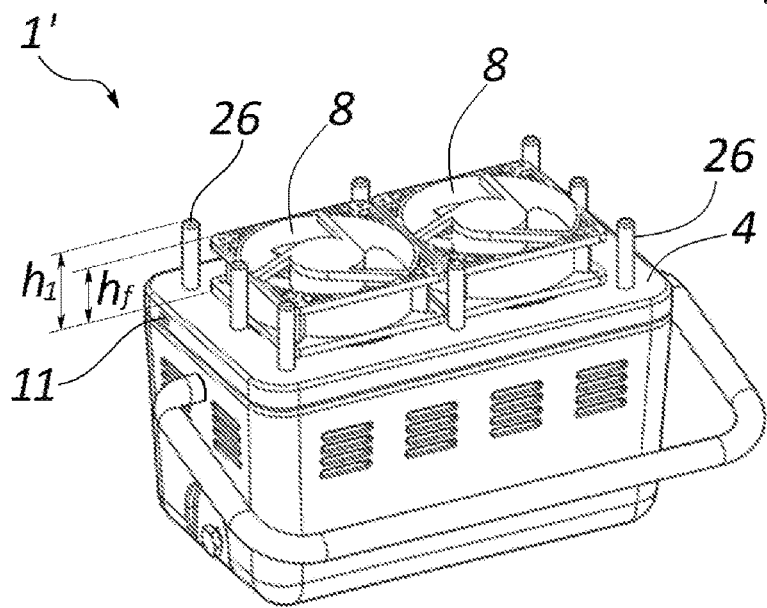
FIG. 8a shows an oblique view of yet another alternative embodiment of a portable air cooler in accordance with the invention wherein fans are secured to an external surface of the lid.

FIG. 8a shows an oblique view of yet another alternative embodiment [1'] of a portable air cooler in accordance with the invention wherein a set of at least one fan [8] are secured to an external surface of the lid [4.] The fans are electrically connected to a power receptacle [11] affixed to or embedded into the lid. A plurality of struts [26] arise from the external surface of the lid to a first height $[h_1.]$ Any one fan from among the set defines a fan height $[h_f]$ which is less than the first height of the struts. The difference in heights creates a space above the fans and beneath the device to be cooled when rested atop the plurality of struts.

Figure 8B:
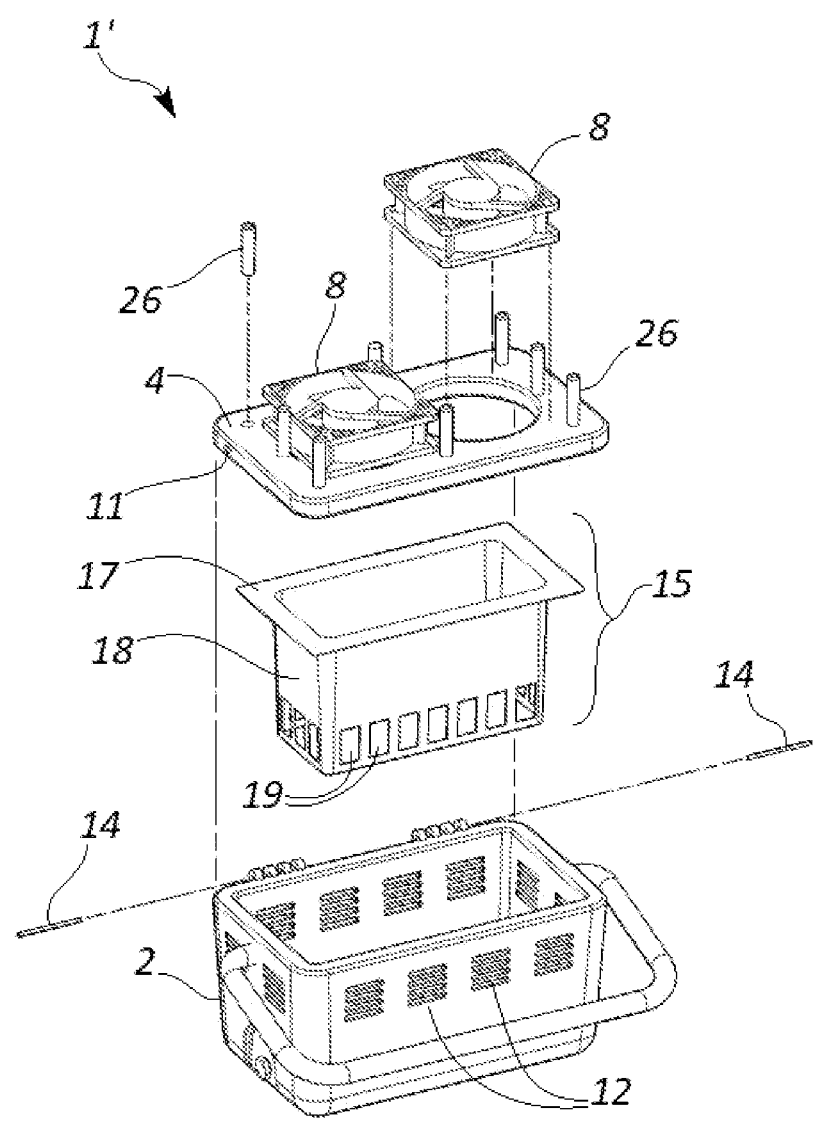

FIG. 8b shows an exploded view of components of the alternative embodiment [1'] of the portable air cooler of FIG. 8a. The lid [4] may be hingeably coupled to the cooler or chest [2] by hinge pins [14.] The box portion of the cooler has sidewalls and a floor which define a compartment having interior surfaces and define an interior rim of the compartment. At least one such sidewall is pierced by at least one intake vent [12] and preferably more than one or all sidewalls include arrays of vents which may prefer-ably be numerous and narrow as shown, or may have larger openings which are covered by louvered plates or screens to exclude undesirable indrawn foreign matter or insects.

A baffle component [15] fits inside the chest. It has a membrane surface having a contour or perimeter complementary to the interior rim of the compartment of the chest. The planar surface is a flange [17] extending from the upper end of a duct [18] which pierces the membrane, and the duct has a perimeter wall or contour offset from at least one of the interior surfaces of the compartment. According to some embodiments the duct portion of the baffle further comprises at least one cutout in its walls such as a cutout which is an aperture [19.]

The interior compartment is closable by a lid [4] having an external surface pierced by at least one aperture defining an air passageway communicating with the interior compartment. A set of at least one fan [8] is secured to the external surface of the lid and aligned with the air passageway to communicate with the interior compartment. The lid further comprises a plurality of struts arising from the external surface of lid. According to some embodiments the struts may be permanently affixed to the lid, and in other embodiments blind or through apertures in the lid receive the struts, which may also be optionally threaded and received within complementarily threaded apertures or cavities. Other embodiments include extendable and retractable struts which click-lock between extended and retracted positions. In preferable embodiments the struts extend above the surface of the lid by a first height and the fans define a fan height less than the first height to create a clearance for air flow beneath the device intended to be cooled when placed atop the struts. A power receptacle [11] built into the lid electrically connects to at least one fan within the set of fans.

While certain features and aspects have been described with respect to exemplary embodiments, one skilled in the art will recognize that numerous modifications are possible. Also, while certain functionality is ascribed to certain system components, unless the context dictates otherwise, this functionality may be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Furthermore, the procedures described with respect to one method or process may be incorporated within other described methods or processes; likewise, system components described according to a particular structural configuration and/or with respect to one system may be organized in alternative structural configurations and/or incorporated within other described systems.

The present disclosure is not to be limited in terms of the particular embodiments described in this application, which are intended as illustrations of various aspects. Many modifications and variations may be made without departing from its spirit and scope. Functionally equivalent methods and apparatuses within the scope of the disclosure, in addition to those enumerated herein, are possible from the foregoing descriptions. Such modifications and variations are intended to fall within the scope of the appended claims. The present disclosure is to be limited only by the terms of the appended claims, along with the full scope of equivalents to which such claims are entitled.

Hence, while various embodiments are described with or without certain features for ease of description and to illustrate exemplary aspects of those embodiments, the various components and/or features described herein with respect to a particular embodiment may be substituted, added, and/or subtracted from among other described embodiments, unless the context dictates otherwise. Thus, unauthorized instances of apparatuses and methods claimed herein are to be considered infringing, no matter where in the world they are advertised, sold, offered for sale, used, possessed, or performed.

Consequently and in summary, although many exemplary embodiments are described above, it will be appreciated that the invention is intended to cover all modifications and equivalents within the scope of the following claims.

What is claimed is:

1. A thermally insulated cooler comprising sidewalls and a floor that define a compartment having interior surfaces and an interior rim of said compartment, said compartment pierced by at least one intake vent and closable by a lid having an external surface pierced by at least one aperture defining an air passageway communicating with said compartment, a set of at least one fan secured to said external surface of said lid and aligned with said air passageway, with said lid further comprising
 a plurality of struts arising from said external surface of said lid and
 a power receptacle electrically connected to said at least one fan, and
 a baffle comprising a membrane pierced by a duct having a perimeter wall offset from at least one of said interior surfaces of said compartment.

2. The thermally insulated cooler of claim 1, wherein said membrane of said baffle comprises a perimeter complementary to said interior rim of said compartment.

3. The thermally insulated cooler of claim 1, wherein said interior compartment is pierced by a drain aperture.

4. The thermally insulated cooler of claim 1, wherein said intake vent pierces any one sidewall from among said sidewalls of said compartment.

5. The thermally insulated cooler of claim 1, wherein said duct of said baffle further comprises a cutout.

6. The thermally insulated cooler of claim 1, wherein said duct of said baffle further comprises an aperture.

7. The thermally insulated cooler of claim 1, wherein said duct of said baffle further comprises a compressible material.

8. The thermally insulated cooler of claim 1, wherein said duct of said baffle is retained by contact with any one of said sidewalls of said compartment so that a gap exists between said baffle and said floor of said compartment.

9. The thermally insulated cooler of claim 1, further comprising at least one fence section component having at least one post, and wherein said lid further comprises at least one post-receiving aperture.

10. The thermally insulated cooler of claim 9, wherein at least any one strut from among said plurality of struts arises from said external surface of said lid to a first height, and any one fence section from at said at least one fence section extends to a second height above said external surface of said lid greater than said first height.

11. The thermally insulated cooler of claim 1, wherein at least any one strut from among said plurality of struts arises from said external surface of said lid to a first height, and any one fan from among said set of at least one fan secured to said external surface of said lid defines a fan height less than said first height.

12. The thermally insulated cooler of claim 1, wherein said lid further comprises a groove.

13. The thermally insulated cooler of claim 12, further comprising at least one fence section component received into said groove in said lid.

14. The thermally insulated cooler of claim 1, wherein at least any one strut from among said plurality of struts is moveable between an extended position and a retracted position.

15. The thermally insulated cooler of claim 1, wherein said lid further comprises a guard component moveable between an extended position and a retracted position.

16. The thermally insulated cooler of claim 15, wherein said guard component further comprises a closed contour.

17. The thermally insulated cooler of claim 15, wherein said guard component further comprises an arcuate section residing between first and second straight sections.

* * * * *